(12) United States Patent
Shin et al.

(10) Patent No.: US 12,477,916 B2
(45) Date of Patent: Nov. 18, 2025

(54) DISPLAY DEVICE

(71) Applicant: LG Display Co., Ltd., Seoul (KR)

(72) Inventors: SeungHwan Shin, Jeonju-si (KR); WonHo Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 516 days.

(21) Appl. No.: 17/980,727

(22) Filed: Nov. 4, 2022

(65) Prior Publication Data

US 2023/0217767 A1 Jul. 6, 2023

(30) Foreign Application Priority Data

Dec. 31, 2021 (KR) .................. 10-2021-0194484

(51) Int. Cl.
| | |
|---|---|
| *H10K 59/35* | (2023.01) |
| *G09G 3/3291* | (2016.01) |
| *H10D 86/40* | (2025.01) |
| *H10D 86/60* | (2025.01) |
| *H10K 59/121* | (2023.01) |
| *H10K 59/131* | (2023.01) |

(52) U.S. Cl.
CPC ......... *H10K 59/353* (2023.02); *G09G 3/3291* (2013.01); *H10D 86/441* (2025.01); *H10D 86/60* (2025.01); *H10K 59/1213* (2023.02); *H10K 59/1216* (2023.02); *H10K 59/131* (2023.02); *H10K 59/351* (2023.02)

(58) Field of Classification Search
CPC ... H10K 59/351; H10K 59/121; G09G 3/2003
See application file for complete search history.

(56) References Cited

U.S. PATENT DOCUMENTS

| | | | |
|---|---|---|---|
| 2008/0231556 A1* | 9/2008 | Kretz ................... | H10K 59/131 345/76 |
| 2011/0063281 A1* | 3/2011 | Hsu ....................... | G09G 3/3677 345/204 |
| 2011/0156992 A1 | 6/2011 | Moon et al. | |
| 2011/0241526 A1* | 10/2011 | Huang ................. | G09G 3/3648 313/307 |
| 2013/0222442 A1* | 8/2013 | Gu ........................ | G09G 3/2003 345/694 |
| 2014/0043372 A1* | 2/2014 | Xi ......................... | H10K 59/131 345/690 |

(Continued)

OTHER PUBLICATIONS

European Patent Office, Extended European Search Report and Opinion, EP Patent Application No. 22204646.8, May 22, 2023, ten pages.

*Primary Examiner* — Yuzhen Shen
(74) *Attorney, Agent, or Firm* — Fenwick & West LLP

(57) ABSTRACT

A display device according to an exemplary embodiment of the present disclosure includes a display panel in which a plurality of pixels including a first sub-pixel, a second sub-pixel, a third sub-pixel, and a fourth sub-pixel that have different colors are disposed; a data driver configured to supply data voltages to the plurality of pixels through a plurality of data lines; and a gate driver configured to supply gate signals to the plurality of pixels through a plurality of gate lines; wherein the first sub-pixel, the second sub-pixel, the third sub-pixel, and the fourth sub-pixel are sequentially disposed in the same column, so that it is possible to improve a charging rate of a data voltage.

15 Claims, 7 Drawing Sheets

(56) References Cited

U.S. PATENT DOCUMENTS

| | | | |
|---|---|---|---|
| 2016/0125779 A1* | 5/2016 | Lin | G09G 3/20 |
| | | | 345/215 |
| 2016/0155400 A1* | 6/2016 | Namkung | G09G 3/3607 |
| | | | 345/205 |
| 2018/0033383 A1* | 2/2018 | Kim | G09G 3/3607 |
| 2018/0197934 A1* | 7/2018 | Chen | G09G 3/32 |
| 2021/0201829 A1 | 7/2021 | Seo et al. | |
| 2024/0221586 A1* | 7/2024 | Zhang | G09G 3/2092 |
| 2024/0290233 A1* | 8/2024 | Yin | G01R 19/2509 |

\* cited by examiner

DISPLAY DEVICE

CROSS-REFERENCE TO RELATED APPLICATIONS

This application claims the benefit of and priority to Korean Patent Application No. 10-2021-0194484 filed on Dec. 31, 2021, in the Korean Intellectual Property Office, which is incorporated herein by reference.

BACKGROUND

Field

The present disclosure relates to a display device, and more particularly, to a display device capable of being driven at a high driving frequency.

Discussion of the Related Art

Display devices used in computer monitors, TVs, and mobile phones include organic light emitting displays (OLEDs) that emit light by themselves, and liquid crystal displays (LCDs) that require a separate light source.

Among these various display devices, an organic light emitting display device includes a display panel including a plurality of sub-pixels and a driver driving the display panel. The driver includes a gate driver that supplies a gate signal to the display panel and a data driver that supplies a data voltage. When signals such as a gate signal and a data voltage are supplied to the sub-pixels of the organic light emitting display device, the selected sub-pixels emit light to display an image.

Recently, as display panels have become larger, DRD (Double Rate Driving) is performed in which the driving frequency is increased to smoothly drive the display panel. When the driving frequency is increased in this way, the time for charging the data voltage of the sub-pixel is rapidly reduced. Accordingly, there is a defect in that data cannot be completely charged in the sub-pixel.

SUMMARY

An object of the present disclosure is to provide a display device including a sensing transistor for sensing a characteristic value of a sub-pixel.

Another object of the present disclosure is to provide a display device allowing for an improved in sensing speed.

Objects of the present disclosure are not limited to the above-mentioned objects, and other objects, which are not mentioned above, can be clearly understood by those skilled in the art from the following descriptions.

A display device according to an exemplary embodiment of the present disclosure includes a display panel in which a plurality of pixels including a first sub-pixel, a second sub-pixel, a third sub-pixel, and a fourth sub-pixel that have different colors are disposed; a data driver configured to supply data voltages to the plurality of pixels through a plurality of data lines; and a gate driver configured to supply gate signals to the plurality of pixels through a plurality of gate lines; wherein the first sub-pixel, the second sub-pixel, the third sub-pixel, and the fourth sub-pixel are sequentially disposed in the same column, so that it is possible to improve a charging rate of a data voltage.

Other matters of the exemplary embodiments are included in the detailed description and the drawings.

According to the present disclosure, a light emitting area can be designed to be expanded, an opening ratio of a display device can be improved.

According to the present disclosure, by reducing an RC delay of a data signal, a charging rate of the data signal can be increased.

According to the present disclosure, even in a specific pattern, it is possible to control the charging rate of the data signal to be constant.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
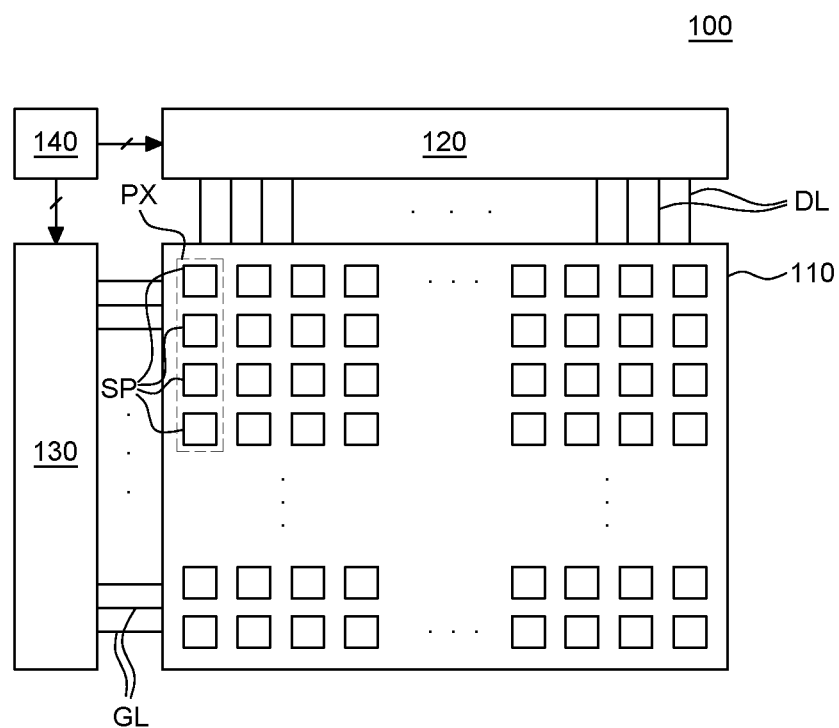
FIG. 1 is a schematic diagram of a display device according to an example of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

A transistor used in a display device of the present disclosure may be implemented as at least one of an n-channel transistor (NMOS) and a p-channel transistor (PMOS). The transistor may be implemented as an oxide semiconductor transistor having an oxide semiconductor as an active layer or an LTPS transistor having a low temperature polysilicon (LTPS) as an active layer. The transistor may include at least a gate electrode, a source electrode, and a drain electrode. The transistor may be implemented as a thin film transistor (TFT) on a display panel. In the transistor, carriers flow from the source electrode to the drain electrode. In the case of an n-channel transistor (NMOS), since carriers are electrons, a voltage of the source electrode is lower than a voltage of the drain electrode so that the electrons can flow from the source electrode to the drain electrode. In the n-channel transistor (NMOS), a current may flow from the drain electrode to the source electrode, and the source electrode may be an output terminal. In the case of a p-channel transistor (PMOS), since carriers are holes, a source voltage is higher than a drain voltage so that holes can flow from the source electrode to the drain electrode. In the p-channel transistor (PMOS), since holes flow from the source electrode to the drain electrode, a current flows from a source to a drain, and the drain electrode may be an output terminal. Therefore, it should be noted that the source and the drain of the transistor are not fixed because the source and the drain can be changed according to a voltage applied thereto. In the present specification, descriptions are made assuming that the transistor is an n-channel transistor (NMOS), but the present disclosure is not limited thereto, and a p-channel transistor may be used, and thus, a circuit configuration may be changed.

A gate signal of transistors used as switching elements swings between a gate-on voltage and a gate-off voltage. The gate-on voltage is set to a voltage higher than a threshold voltage Vth of the transistor, and the gate-off voltage is set to a voltage lower than the threshold voltage Vth of the transistor. The transistor is turned on in response to the gate-on voltage, while turned off in response to the gate-off voltage. In the case of the NMOS, the gate-on voltage may be a gate high voltage VGH, and the gate-off voltage may be a gate low voltage VGL. In the case of the PMOS, the gate-on voltage may be the gate low voltage VGL, and the gate-off voltage may be the gate high voltage VGH.

Hereinafter, various exemplary embodiments of the present disclosure will be described in detail with reference to the accompanying drawings.

FIG. 1 is a schematic diagram of a display device according to an exemplary embodiment of the present disclosure. Referring to FIG. 1, a display device 100 includes a display panel 110, a gate driver 120, a data driver 130, and a timing controller 140.

The display panel 110 is a panel for displaying an image. The display panel 110 may include various circuits, lines, and light emitting elements disposed on a substrate. The display panel 110 is divided by a plurality of data lines DL and a plurality of gate lines GL that cross each other, and may include a plurality of pixels PX that are connected to the plurality of data lines DL and the plurality of gate lines GL. The display panel 110 may include an active area defined by the plurality of pixels PX and a non-active area in which various signal lines, pads and the like are formed. The display panel 110 may be implemented as the display panel 110 that is used in various display devices such as a liquid crystal display device, an organic light emitting display device, an electrophoretic display device, and the like. Hereinafter, it will be described that the display panel 110 is a panel used in an organic light emitting display device, but the present disclosure is not limited thereto.

The timing controller 140 receives timing signals such as a vertical synchronization signal, a horizontal synchronization signal, a data enable signal, a dot clock signal and the like through a receiving circuit such as an LVDS or TMDS interface that is connected to a host system. The timing controller 140 generates timing control signals for controlling the data driver 130 and the gate driver 120 based on input timing signals.

The data driver 130 supplies data voltage DATA to a plurality of sub-pixels SP. The data driver 130 may include a plurality of source drive integrated circuits (ICs). The plurality of source drive ICs may receive digital video data and a source timing control signal from the timing controller 140. The plurality of source drive ICs may generate the data voltage VDATA by converting the digital video data into a gamma voltage in response to the source timing control signal, and supply the data voltage VDATA through the data lines DL of the display panel 110. The plurality of source drive ICs may be connected to the data lines DL of the display panel 110 by a chip on glass (COG) process or a tape automated bonding (TAB) process. Also, the source drive ICs may be formed on the display panel 110 or formed on a separate PCB substrate and connected to the display panel 110.

The gate driver 120 supplies gate signals to the plurality of sub-pixels SP. The gate driver 120 may include a level shifter and a shift register. The level shifter may shift a level of a clock signal which is input as a transistor-transistor-logic (TTL) level from the timing controller 140 and then, supply it to the shift register. The shift register may be formed in the non-active area of the display panel 110 by the GIP method, but is not limited thereto. The shift register may be configured of a plurality of stages that shift and output the gate signals in response to the clock signal and a driving signal. The plurality of stages included in the shift register may sequentially output the gates signals through a plurality of output terminals.

The display panel 110 may include the plurality of sub-pixels SP. The plurality of sub-pixels SP may be sub-pixels SP for emitting light of different colors. For example, each of the plurality of sub-pixels SP may be a red sub-pixel, a green sub-pixel, a blue sub-pixel, and a white sub-pixel, but is not limited thereto. The plurality of sub-pixels SP may constitute the pixels PX. That is, the red sub-pixel, the green sub-pixel, the blue sub-pixel, and the white sub-pixel may constitute one pixel PX, and the display panel 110 may include the plurality of pixels PX.

Figure 2:
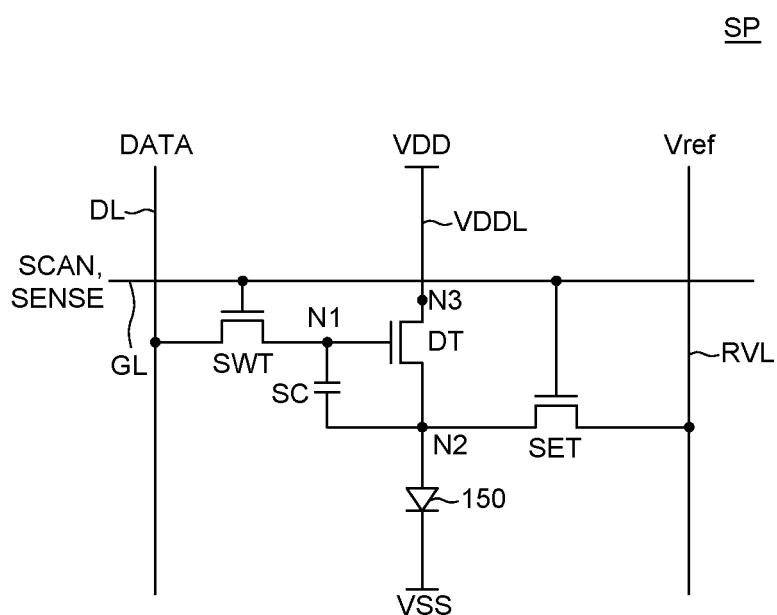
FIG. 2 is a circuit diagram of a sub-pixel of the display device according to an example of the present disclosure.

Hereinafter, FIG. 2 is referred together for a more detailed description of a driving circuit for driving one sub-pixel SP.

FIG. 2 is a circuit diagram of a sub-pixel of the display device according to an exemplary embodiment of the present disclosure. FIG. 2 is a circuit diagram of one sub-pixel SP among the plurality of sub-pixels SP of the display device 100.

Referring to FIG. 2, the sub-pixel SP may include a switching transistor SWT, a sensing transistor SET, a driving transistor DT, a storage capacitor SC, and a light emitting element 150.

The light emitting element 150 may include an anode, an organic layer, and a cathode. The organic layer may include various organic layers such as a hole injection layer, a hole transport layer, an organic light emitting layer, an electron transport layer, an electron injection layer and the like. The anode of the light emitting element 150 may be connected to the output terminal of the driving transistor DT, and a low potential voltage VSS may be applied to the cathode. Although it is described that the light emitting element 150 is an organic light emitting element 150 in FIG. 2, the present disclosure is not limited thereto, and an inorganic light emitting diode, i.e., an LED, may also be used as the light emitting element 150.

Referring to FIG. 2, the switching transistor SWT is a transistor for transmitting the data voltage DATA to a first node N1 corresponding to a gate electrode of the driving transistor DT. The switching transistor SWT may include a drain electrode connected to the data line DL, the gate electrode connected to the gate line GL, and a source electrode connected to the gate electrode of the driving transistor DT. The switching transistor SWT is turned on by a scan signal SCAN that is applied from the gate line GL and may transmit the data voltage DATA supplied from the data line DL to the first node N1 corresponding to the gate electrode of the driving transistor DT.

Referring to FIG. 2, the driving transistor DT is a transistor for driving the light emitting element 150 by configured to supply a driving current to the light emitting element 150. The driving transistor DT may include a gate electrode corresponding to the first node N1, a source electrode corresponding to a second node N2 and corresponding to an output terminal, and a drain electrode corresponding to a third node N3 and corresponding to an input terminal. The gate electrode of the driving transistor DT may be connected to the switching transistor SWT, the drain electrode thereof may receive a high potential voltage VDD through a high potential voltage line VDDL, and the source electrode thereof may be connected to the anode of the light emitting element 150.

Referring to FIG. 2, the storage capacitor SC is a capacitor for maintaining a voltage corresponding to the data voltage DATA during one frame. One electrode of the storage capacitor SC may be connected to the first node N1, and the other electrode thereof may be connected to the second node N2.

Meanwhile, in the case of the display device 100, as a driving time of each sub-pixel SP increases, degradation of circuit elements such as the driving transistor DT and the like may be proceeded. Accordingly, an intrinsic characteristic value of the circuit element such as the driving transistor DT or the like may be changed. Here, the intrinsic characteristic value of the circuit element may include a threshold voltage Vth of the driving transistor DT, a mobility a of the driving transistor DT, and the like. A change in the characteristic value of the circuit element may cause a change in luminance of the sub-pixel SP corresponding thereto. Accordingly, the change in the characteristic value of the circuit element may be used as the same concept as the change in the luminance of the sub-pixel SP.

In addition, degrees of changes in the characteristic value between the circuit elements of the respective sub-pixels SP may be different according to differences in degrees of degradation of the respective circuit elements. Differences in degrees of changes in the characteristic value between the circuit elements may cause a luminance deviation between the sub-pixels SP. Accordingly, a characteristic value deviation between the circuit elements may be used as the same concept as the luminance deviation between the sub-pixels SP. A change in the characteristic value of the circuit element, that is, a change in luminance of the sub-pixel SP and the characteristic value deviation between the circuit elements, that is, the luminance deviation between the sub-pixels SP, may reduce an accuracy of luminance expressiveness of the sub-pixel SP, or may cause defects such as generating screen abnormalities.

Accordingly, in the sub-pixel SP of the display device 100 according to an exemplary embodiment of the present disclosure, a sensing function for sensing a characteristic value of the sub-pixel SP and a compensation function for compensating the characteristic value of the sub-pixel SP using a sensing result can be provided.

Accordingly, as shown in FIG. 2, the sub-pixel SP may further include a sensing transistor SET for effectively controlling a voltage state of the source electrode of the driving transistor DT in addition to the switching transistor SWT, the driving transistor DT, the storage capacitor SC, and the light emitting element 150.

Referring to FIG. 2, the sensing transistor SET is connected between the source electrode of the driving transistor DT and a reference voltage line RVL configured to supply a reference voltage Vref, and a gate electrode thereof is connected to the gate line GL. Accordingly, the sensing transistor SET is turned on by a sensing signal SENSE applied through the gate line GL and may apply the reference voltage Vref that is supplied through the reference voltage line RVL to the source electrode of the driving transistor DT. Also, the sensing transistor SET may be used as one of voltage sensing paths for the source electrode of the driving transistor DT.

Referring to FIG. 2, the switching transistor SWT and the sensing transistor SET of the sub-pixel SP may share one gate line GL. That is, the switching transistor SWT and the sensing transistor SET may be applied to the same gate line GL to receive the same gate signal. However, for convenience of explanation, a voltage that is applied to the gate electrode of the switching transistor SWT is referred to as the scan signal SCAN, and a voltage that is applied to the gate electrode of the sensing transistor SET is referred to as the sensing signal SENSE, but the scan signal SCAN and the sensing signal SENSE that are applied to one sub-pixel SP are the same signals transmitted from the same gate line GL. Accordingly, in FIG. 3, the scan signal SCAN and the sensing signal SENSE will be defined and described as gate signals GATE1, GATE2, GATE3, and GATE4.

However, the present disclosure is not limited thereto, and only the switching transistor SWT may be connected to the gate line GL, and the sensing transistor SET may be connected to a separate sensing line. Accordingly, the scan signal SCAN may be applied to the switching transistor SWT through the gate line GL, and the sensing signal SENSE may be applied to the sensing transistor SET through the sensing line.

Accordingly, the reference voltage Vref is applied to the source electrode of the driving transistor DT through the sensing transistor SET. A voltage for sensing the threshold voltage Vth of the driving transistor DT or the mobility a of the driving transistor DT is detected through the reference voltage line RVL. In addition, the data driver 130 may compensate the data voltage DATA according to a detected variation in the threshold voltage Vth of the driving transistor DT or the mobility a of the driving transistor DT.

Figure 3:
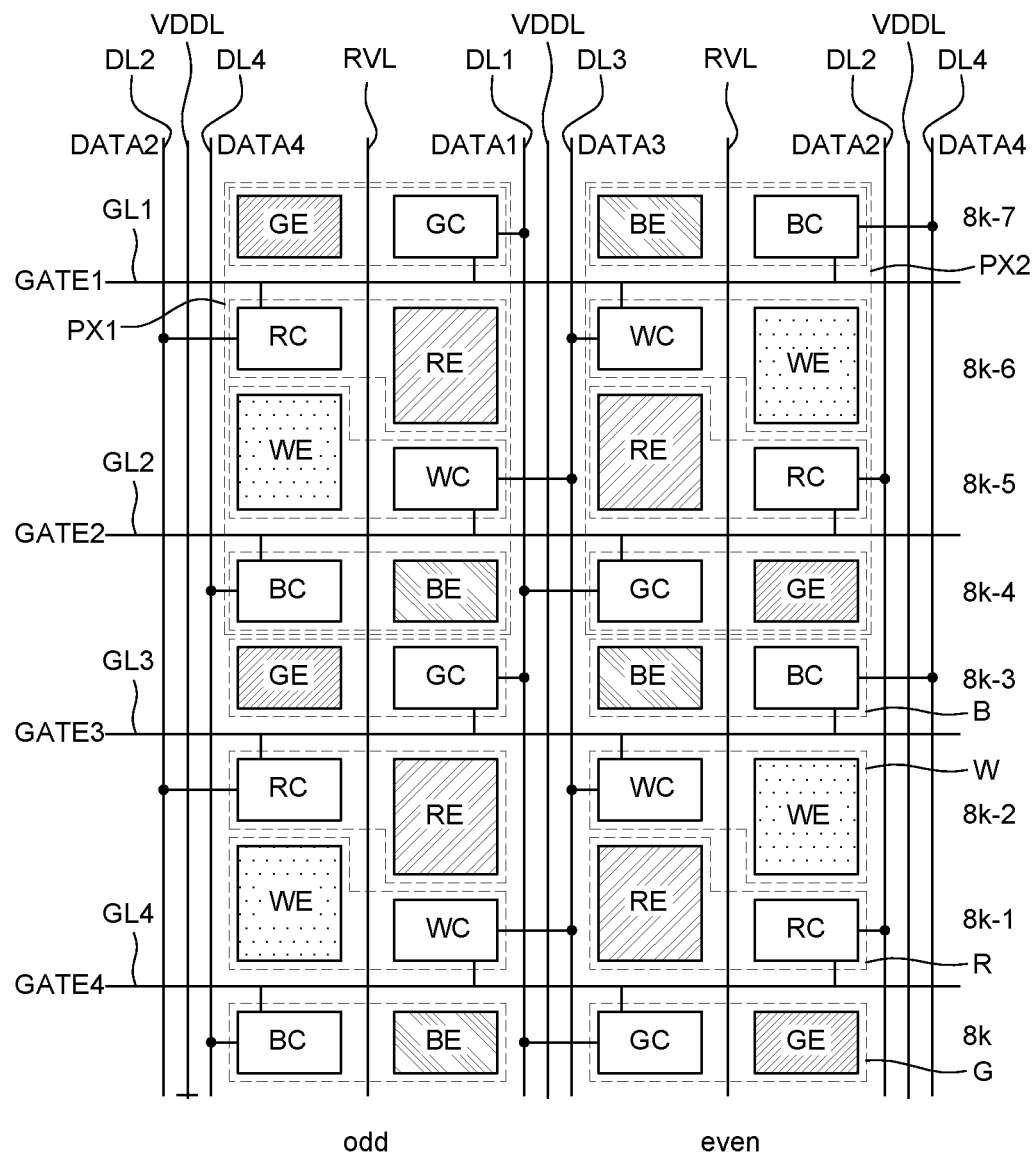
FIG. 3 is a block diagram illustrating an disposition relationship of sub-pixels of the display device according to an example of the present disclosure.

Hereinafter, FIG. 3 is referred together for a more detailed description of a disposition relationship of the plurality of sub-pixels.

FIG. 3 is a block diagram illustrating a disposition relationship (positioning) of sub-pixels of the display device according to an exemplary embodiment of the present disclosure.

For convenience of explanation, only four pixels disposed in 2×2 matrix form are illustrated in FIG. 3, and a disposition relationship of the four pixels disposed in 2×2 matrix form is repeated in the active area.

Referring to FIG. 3, one pixel PX includes four sub-pixels R, G, B and W. For example, the pixels PX may include a first sub-pixel G, a second sub-pixel R, a third sub-pixel W, and a fourth sub-pixel B as shown in FIG. 3. Also, the first sub-pixel G may be a green sub-pixel, the second sub-pixel R may be a red sub-pixel, the third sub-pixel W may be a white sub-pixel, and the fourth sub-pixel B may be a blue sub-pixel. However, the present disclosure is not limited thereto, and the plurality of sub-pixels may be changed to have various colors (magenta, yellow, and cyan).

In addition, the first sub-pixel G, the second sub-pixel R, the third sub-pixel W, and the fourth sub-pixel B may be sequentially disposed in the same column.

Specifically, a first pixel PX1 disposed in an odd-numbered column has a sequential disposition relationship (a sequential order) of the first sub-pixel G, the second sub-pixel R, the third sub-pixel W, and the fourth sub-pixel B. On the other hand, a second pixel PX2 disposed in an even-numbered column has a sequential disposition relationship (a sequential order) of the fourth sub-pixel B, the third sub-pixel W, the second sub-pixel R, and the first sub-pixel G. That is, the sub-pixels R, G, B, and W of the first pixel PX1 and the sub-pixels R, G, B, and W of the second pixel PX2 have vertically inverted symmetry to the high potential voltage line VDDL. However, a disposition order of the sub-pixels R, G, B, and W of each of the first pixel PX1 and the second pixel PX2 is not limited thereto.

More specifically, as shown in FIG. 3, in the odd-numbered column, the first sub-pixel G is disposed in an 8k-7th row and an 8k-3rd row, whereas in the even-numbered column, the first sub-pixel G is disposed in an 8k-4th row and an 8kth row. And, in the odd-numbered column, the second sub-pixel R is disposed in an 8k-6th row and an 8k-2nd row, whereas in the even-numbered column, the second sub-pixel R is disposed in an 8k-5th row and an 8k-1st row. And, in the odd-numbered column, the third sub-pixel W is disposed in the 8k-5th row and the 8k-1st row, whereas in the even-numbered column, the third sub-pixel W is disposed in the 8k-6th row and the 8k-2nd row. And, in the odd-numbered column, the fourth sub-pixel B is disposed in the 8k-4th row and the 8kth row, whereas in the even-numbered column, the fourth sub-pixel B is disposed in the 8k-7th row and the 8k-3rd row. However, k means a natural number greater than or equal to 1.

In addition, the first sub-pixel G may include a first light emitting element GE and a first circuit element GC, the second sub-pixel R may include a second light emitting element RE and a second circuit element RC, the third sub-pixel W may include a third light emitting element WE and a third circuit element WC, and the fourth sub-pixel B may include a fourth light emitting element BE and a fourth circuit element BC.

In addition, the first circuit element GC, the second circuit element RC, the third circuit element WC, and the fourth circuit element BC are disposed in diagonal directions based on the data line DL1, the data line DL2, the data line DL3, and the data line DL4. In other words, first to fourth circuit elements are disposed in diagonal directions between DL1 and DL4 or between DL3 and DL2. Further, the first to fourth circuit elements may be disposed in a diagonal (saw tooth) arrangement within the same pixel. In addition, the first light emitting element GE, the second light emitting element RE, the third light emitting element WE, and the fourth light emitting element BE are also disposed in diagonal directions based on the data line DL1, the data line DL2, the data line DL3, and the data line DL4. In other words, first to fourth light emitting elements are disposed in diagonal directions between DL4 and DL1 or between DL2 and DL3. Further, the first to fourth light emitting elements may be disposed in a diagonal (saw tooth) arrangement within the same pixel. The first to fourth light emitting elements and the first to fourth circuit elements may be arranged in reverse saw tooth manner with respect to one another about the RVL. A disposition relationship of the first to fourth circuit elements and the first to fourth light emitting elements in an odd-numbered column may be positioned as a 180 degree rotation with respect to a disposition relationship of the first to fourth circuit elements and the first to fourth light emitting elements in an even-numbered column, and vice versa.

That is, the first circuit element GC, the second circuit element RC, the third circuit element WC, and the fourth circuit element BC are only disposed in a vertical direction and a horizontal direction based on each of the first light emitting element GE, the second light emitting element RE, the third light emitting element WE, and the fourth light emitting element BE, but the first light emitting element GE, the second light emitting element RE, the third light emitting element WE, and the fourth light emitting element BE are not disposed adjacent to each other in either the vertical direction or the horizontal direction.

In addition, each of a plurality of data lines DL1, DL2, DL3 and DL4 includes a first data line DL1 connected to a plurality of the first sub-pixels G, a second data line DL2 connected to a plurality of the second sub-pixels R, a third data line DL3 connected to a plurality of the third sub-pixels W, and a fourth data line DL4 connected to the fourth sub-pixels B. In addition, the first data line DL1 and the third data line DL3 may be disposed on one side of the plurality of pixels, and the second data line DL2 and the fourth data line DL4 may be disposed on the other side of the plurality of pixels.

Based on the plurality of first pixels PX1, the first data line DL1 and the third data line DL3 may be disposed on a right of the plurality of sub-pixels R, G, B, and W, and may be connected to each of the plurality of first sub-pixels G and the plurality of third sub-pixels W respectively.

In addition, based on the plurality of first pixels PX1, the second data line DL2 and the fourth data line DL4 may be disposed on a left of the plurality of sub-pixels R, G, B, and W, and may be connected to each of the plurality of second sub-pixels R and the plurality of fourth sub-pixels B respectively.

Conversely, based on the plurality of second pixels PX2, the second data line DL2 and the fourth data line DL4 may be disposed on the right of the plurality of sub-pixels R, G, B, and W, and may be connected to each of the plurality of second sub-pixels R and the plurality of fourth sub-pixels B respectively.

In addition, based on the plurality of second pixels PX2, the first data line DL1 and the third data line DL3 may be disposed on the left of the plurality of sub-pixels R, G, B, and W, and may be connected to each of the plurality of the first sub-pixels G and the plurality of third sub-pixels W respectively.

Meanwhile, the plurality of data lines DL1, DL2, DL3, and DL4 extending to the plurality of circuit elements GC, RC, WC, and BC may be disposed adjacent to be connected thereto.

That is, the first circuit element GC and the third circuit element WC may be disposed adjacent to the first data line DL1 and the third data line DL3 rather than the second data line DL2 and the fourth data line DL4, and the second circuit element RC and the fourth circuit element BC may be disposed adjacent to the second data line DL2 and the fourth data line DL4 rather than the first data line DL1 and the third data line DL3.

In addition, a first data voltage DATA1 that is a green data voltage may be applied to the first data line DL1, and a second data voltage DATA2 that is a red data voltage may be applied to the second data line DL2. A third data voltage DATA3 that is a white data voltage may be applied to the third data line DL3, and a fourth data voltage DATA4 that is a blue data voltage may be applied to the fourth data line DL4.

In addition, each of a plurality of high potential voltage lines VDDL may be disposed between the data lines DL1, DL2, DL3, and DL4 adjacent to each other.

That is, the high potential voltage line VDDL may be disposed between the first data line DL1 and the third data line DL3, and the high potential voltage line VDDL may be disposed between the second data line DL2 and the fourth data line DL4.

In other words, the high potential voltage line VDDL is disposed between the plurality of first pixels PX1 and the plurality of second pixels PX2. Accordingly, one of the first data line DL1 to the fourth data line DL4 may overlap the high potential voltage line VDDL. For example, in FIG. 3, the third data line DL3 overlaps the high potential voltage line VDDL to be connected to the third sub-pixel W.

Each of the plurality of gate lines GL1 to GL4 may be disposed inside the plurality of pixels PX1 and PX2. That is, the plurality of gate lines GL1 to GL4 may be disposed between the first sub-pixel G and the second sub-pixel R or between the third sub-pixel W and the fourth sub-pixel B.

Specifically, odd-numbered gate lines GL1 and GL3 are disposed between the first sub-pixel G and the second sub-pixel R in the odd-numbered column, and may be disposed between the third sub-pixel W and the fourth sub-pixel B in the even-numbered column.

That is, based on one pixel PX1 or PX2, one odd-numbered gate line GL1 or GL3 may be disposed between the plurality of sub-pixels R, W, G, and B. For example, the first gate line GL1 is disposed between the first sub-pixel G of the first pixel PX1 and the fourth sub-pixel B of the second pixel PX2 that are disposed in the 8k-7th row and the second sub-pixel R of the first pixel PX1 and the third sub-pixel W of the second pixel PX2 that are disposed in the 8k-6th row, and is connected to the first sub-pixel G and the second sub-pixel R of the first pixel PX1 and the third sub-pixel W and the fourth sub-pixel B of the second pixel PX2.

The even-numbered gate lines GL2 and GL4 may be disposed between the third sub-pixels W and the fourth sub-pixels B in the odd-numbered column, and may be disposed between the first sub-pixels G and the second sub-pixels R in the even-numbered column.

That is, one even-numbered gate line GL2 is disposed between the plurality of sub-pixels R, W, G, and B based on one pixel PX1 or PX2. For example, the second gate line GL2 may be disposed between the second sub-pixel R of the second pixel PX2 and the third sub-pixel W of the first pixel PX1 that are disposed in the 8k-5th row, and the first sub-pixel G of the second pixel PX2 and the fourth sub-pixel B of the first pixel PX1 that are disposed in the 8k-4th row, and is connected to the third sub-pixel W and the fourth sub-pixel B of the first pixel PX1 and the first sub-pixel G and the second sub-pixel R of the second pixel PX2.

In addition, each of a plurality of reference voltage lines RVL may be disposed inside each of the plurality of sub-pixels R, G, B, and W.

Specifically, each of the plurality of reference voltage lines RVL is disposed between the first light emitting element GE and the first circuit element GC, is disposed between the second light emitting element RE and the second circuit element RC, is disposed between the third light emitting element WE and the third circuit element WC, and is disposed between the fourth light emitting element BE and the fourth circuit element BC.

One of the plurality of reference voltage lines RVL is connected to the plurality of sub-pixels R, G, B, and W disposed in the odd-numbered column, and the other one of the plurality of reference voltage lines RVL is connected to the plurality of sub-pixels R, G, B, and W disposed in the even-numbered column.

In addition, the first circuit element GC and the third circuit element WC may be disposed to be opposite to the second circuit element RC and the fourth circuit element BC with respect to each of the plurality of reference voltage lines RVL.

As described above, in the display device according to an exemplary embodiment of the present disclosure, the plurality of data lines DL1 and DL3 disposed between the plurality of first pixels PX1 and the plurality of second pixels PX2 may be connected to the plurality of sub-pixels G and W disposed on both sides thereof and apply data voltages DATA1 and DATA3 thereto.

In a conventional display device, a plurality of data lines are connected only to a plurality of sub-pixels disposed on one side thereof, and thus, data lines are required as many as the number of columns of the plurality of sub-pixels.

However, in the display device according to the exemplary embodiment of the present disclosure, the plurality of data lines DL1, DL2, DL3, and DL4 are connected to the plurality of sub-pixels R, G, B, and W disposed on both sides thereof, so only the data lines DL1, DL2, DL3, and DL4 as many as half the number of columns of the sub-pixels R, G, B, and W are required.

Accordingly, as an area occupied by the data lines in a display panel is reduced, a light emitting area can be designed to be expanded, so that an opening ratio of the display device can be improved. For example, an area occupied by a light emitting area in the first sub-pixel G may be 29.4%, an area occupied by a light emitting area in the second sub-pixel R may be 48.2%, an area occupied by a light emitting area in the third sub-pixel W may be 54.8%, and an area occupied by a light emitting area in the fourth sub-pixel B may be 32.8%, so that an average opening ratio may be extended to 41.3%.

Figure 4:
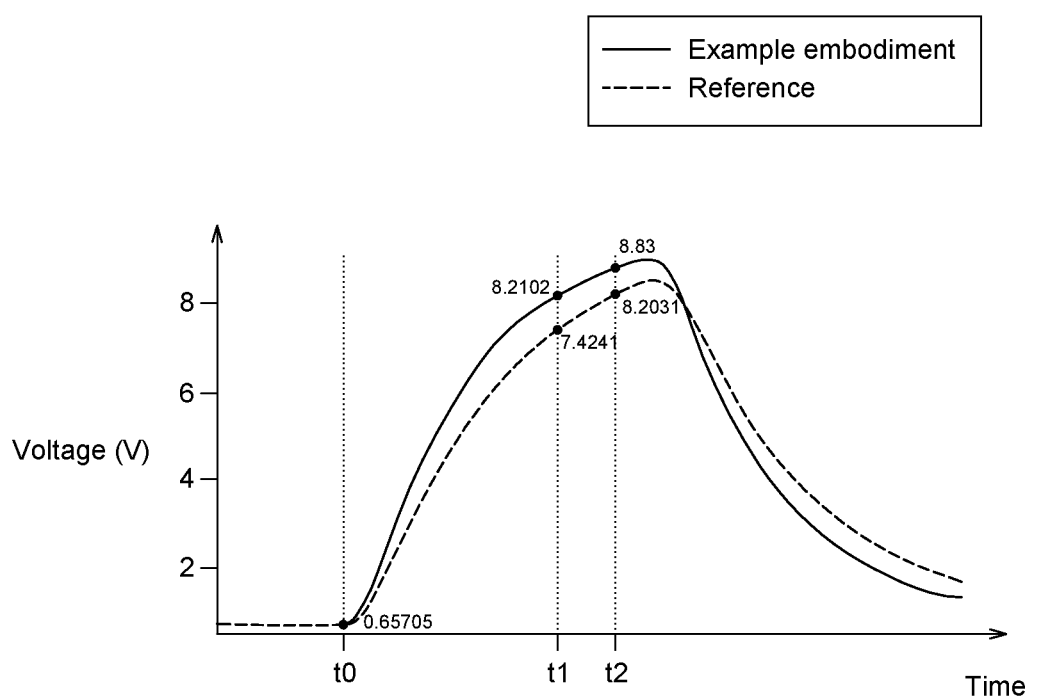
FIG. 4 is a waveform diagram illustrating a data voltage of the display device according to an example of the present disclosure.

FIG. 4 is a waveform diagram illustrating a data voltage of the display device according to an exemplary embodiment of the present disclosure.

In the display device according to an exemplary embodiment of the present disclosure, as the number of data lines is reduced as described above, a total resistance of the data lines is reduced, so that an RC delay of data signals can be reduced. Accordingly, a charging rate of the data signal may be increased.

Specifically, referring to FIG. 4, in a conventional display device, a data voltage starts to be charged from 0.65 V at time t0. Then, at time t1, the data voltage is charged to 7.4241 V, and thereafter, at time t2, the data voltage is charged to 8.2031 V.

On the other hand, in the display device according to an exemplary embodiment of the present disclosure, a data voltage starts to be charged from 0.65 V at time t0. Then, at time t1, the data voltage is charged to 8.2102 V, and thereafter, at time t2, the data voltage is charged to 8.83 V.

That is, at time t1, a data charging rate of the display device according to an exemplary embodiment of the present disclosure may increase by 9.57% compared to a data charging rate of the conventional display device. Further, at time t2, the data charging rate of the display device according to an exemplary embodiment of the present disclosure may increase by 7.09% compared to the data charging rate of the conventional display device. That is, the data charging rate of the display device according to an exemplary embodiment of the present disclosure may be improved.

Hereinafter, a method of driving the display device according to an exemplary embodiment of the present disclosure will be described with reference to FIGS. 5A, 5B, and 6.

Figure 5A:
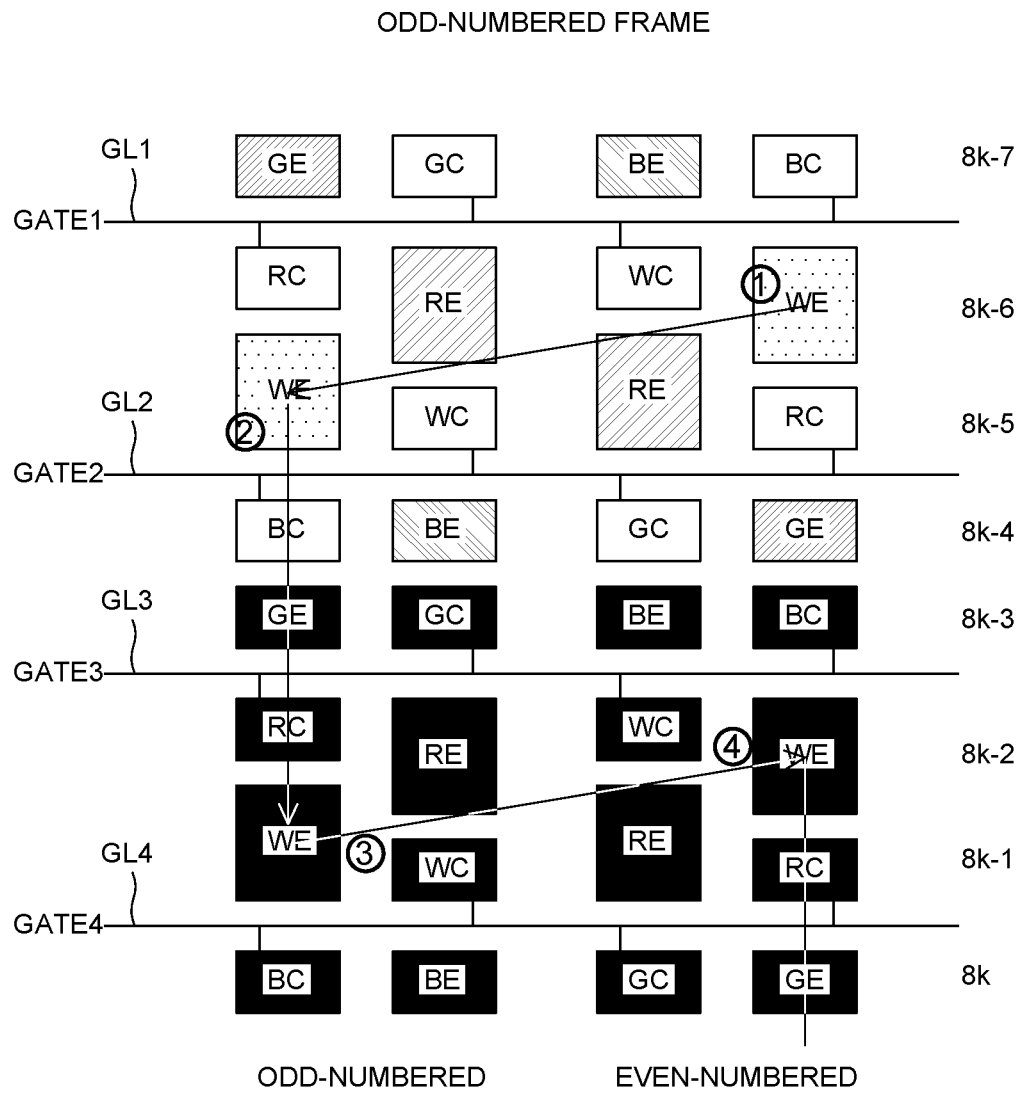
FIG. 5A is a diagram for explaining a driving sequence in an odd-numbered frame of the display device according to an example of the present disclosure.

FIG. 5A is a diagram for explaining a driving sequence in an odd-numbered frame of the display device according to an exemplary embodiment of the present disclosure.

Figure 5B:
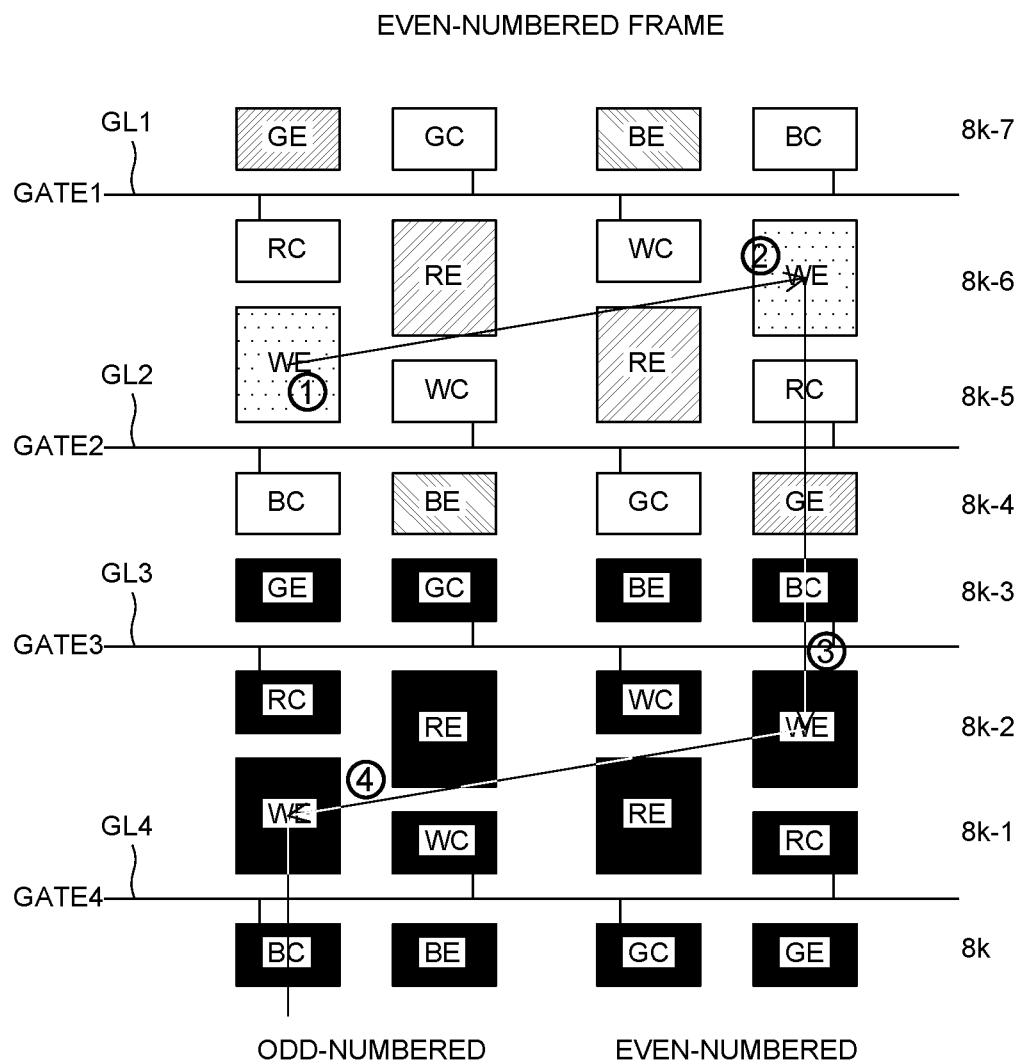
FIG. 5B is a diagram for explaining a driving sequence in an even-numbered frame of the display device according to an example of the present disclosure
Figure 6:
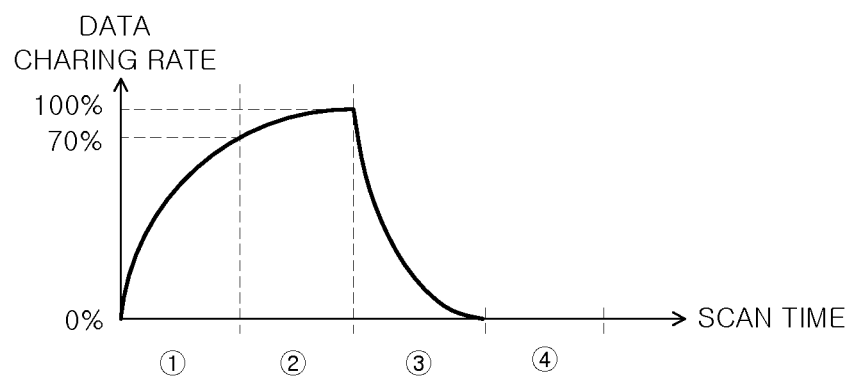
FIG. 6 is a diagram for explaining a charging rate of a data voltage of the display device according to an exemplary embodiment of the present disclosure.

FIG. 5B is a diagram for explaining a driving sequence in an even-numbered frame of the display device according to an exemplary embodiment of the present disclosure FIG. 6 is a diagram for explaining a charging rate of a data voltage of the display device according to an exemplary embodiment of the present disclosure.

Although FIGS. 5A and 5B do not show the data lines, the reference voltage lines, and the high potential voltage lines disposed in the vertical direction for convenience of explanation, disposition relationships of the data lines, the reference voltage lines, and the high potential voltage lines are identical to those described in FIG. 3

FIGS. 5A and 5B illustrate a case of displaying horizontal stripe patterns in which the plurality of sub-pixels R, G, B, and W disposed in an 8k-7th row to am 8k-4th row emit light, and the plurality of sub-pixels R, G, B, and W disposed in an 8k-3rd row to an 8k-th row do not emit light (shown by black shading) will be described.

Hereinafter, a data charging rate of the plurality of third sub-pixels W will be described in detail, but the contents of a data charging rate of the plurality of first sub-pixels G, a data charging rate of the plurality of second sub-pixels R, and a data charging rate of the plurality of fourth sub-pixels B may also be described in the same principle as the data charging rate of the plurality of third sub-pixels W.

As shown in FIG. 6, when a horizontal stripe pattern is displayed, a charging rate of the third data voltage DATA3 may increase during a first horizontal period ① and a second horizontal period ②, and the charging rate of the third data voltage DATA3 may decrease during a horizontal period ③ and a fourth horizontal period ④. A charging rate waveform of the third data voltage DATA3 described above may be repeated.

In FIGS. 5A and 5B, a turn-on order of a plurality of gate lines GL1, GL2, GL3, and GL4 in an odd-numbered frame may be different from a turn-on order of the plurality of gate lines GL1, GL2, GL3, GL4 in an even-numbered frame. The turn-on orders of the plurality of gate lines may be predefined.

Specifically, the first gate line GL1, the second gate line GL2, the fourth gate line GL4, and the third gate line GL3 are sequentially turned on in the odd-numbered frame, and the second gate line GL2, the first gate line GL1, the third gate line GL3, and the fourth gate line GL4 are sequentially turned on in the even-numbered frame.

However, the turn-on order of the plurality of gate lines GL1, GL2, GL3, and GL4 in the odd-numbered frame and the turn-on order of the plurality of gate lines GL1, GL2, GL3, GL4 in the even-numbered frame may be changed.

For example, referring to FIG. 5A, during the odd-numbered frame, in the first horizontal period ①, a first gate voltage GATE1 at a turn-on level is applied to the first gate line GL1, so that the third sub-pixel W disposed in the 8k-6th row is charged with the data voltage.

Then, during the odd-numbered frame, in the second horizontal period ②, a second gate voltage GATE2 at a turn-on level is applied to the second gate line GL2, so that the third sub-pixel W disposed in the 8k-5th row is charged with the data voltage.

Then, during the odd-numbered frame, in the third horizontal period ③, a fourth gate voltage GATE4 at a turn-on level is applied to the fourth gate line GL4, so that the data voltage charged in the third sub-pixel W disposed in the 8k-1st row is discharged.

Then, during the odd-numbered frame, in the fourth horizontal period ④, a third gate voltage GATE3 at a turn-on level is applied to the third gate line GL3, so that the data voltage charged in the third sub-pixel W disposed in the 8k-2nd row is discharged.

And, referring to FIG. 5B, during the even-numbered frame, in the first horizontal period ①, the second gate voltage GATE2 at a turn-on level is applied to the second gate line GL2, so that the third sub-pixel W disposed in the 8k-5th row is charged with the data voltage.

Then, during the even-numbered frame, in the second horizontal period ②, the first gate voltage GATE1 at a turn-on level is applied to the first gate line GL1, so that the third sub-pixel W disposed in the 8k-6th row is charged with the data voltage.

Then, during the even-numbered frame, in the third horizontal period ③, the third gate voltage GATE3 at a turn-on level is applied to the third gate line GL3, so that the data voltage charged in the third sub-pixel W disposed in the 8k-2nd row is discharged.

Then, during the even-numbered frame, in the fourth horizontal period ④, the fourth gate voltage GATE4 at a turn-on level is applied to the fourth gate line GL4, so that the data voltage charged in the third sub-pixel W disposed in the 8k-1st row is discharged.

When implementing the horizontal stripe pattern as described above, the data charging rates of the plurality of third sub-pixels W will be described with reference to FIG. 6 as follows.

During the odd-numbered frame, in the first horizontal period ① in which the charging of the data voltage is started, the data charging rate of the third sub-pixel W disposed in the 8k-6th row may be 70% (weak charging).

And, during the odd-numbered frame, in the second horizontal period ② in which the charging of the data voltage is completed, the charging rate of the third sub-pixel W disposed in the 8k-5th row may be 100% (strong charging).

And, during the odd-numbered frame, in the third horizontal period ③ and the fourth horizontal period ④ in which the data voltage is discharged, the charging rate of the third sub-pixel W disposed in the 8k-2nd row and the third sub-pixel W disposed in the 8k-1st row may be 0%.

During the even-numbered frame, in the first horizontal period ① in which the charging of the data voltage is started, the data charging rate of the third sub-pixel W disposed in the 8k-5th row may be 70% (weak charging).

In addition, during the even-numbered frame, in the second horizontal period ② in which the charging of the data voltage is completed, the charging rate of the third sub-pixel W disposed in the 8k-6th row may be 100% (strong charging).

And, during the even-numbered frame, in the third horizontal period ③ and the fourth horizontal period ④ in which the data voltage is discharged, the charging rate of the third sub-pixel W disposed in the 8k-1st row and the third sub-pixel W disposed in the 8k-2nd row may be 0%.

To summarize this, the data charging rate of the third sub-pixel W disposed in the 8k-5th row 100% (strong charging) during the odd-numbered frame and 70% (weak charging) during the even-numbered frame. Accordingly, an average of data charging rate of the third sub-pixel W disposed in the 8k-5th row may be 85%.

In addition, the data charging rate of the third sub-pixel W disposed in the 8k-6th row is 100% (strong charging) during the even-numbered frame and 70% (weak charging) during the odd-numbered frame. Accordingly, an average of the data charging rates of the third sub-pixel W disposed in the 8k-6th row may also be 85%. In the foregoing, the charging rate during weak charging/strong charging may have different values depending on the data line RC delay of the display panel in question and/or the panel size (inches) and refresh rate (Hz). The weak charge rate may be 40-70%, and the strong charge rate may be 95-100% depending on the panel.

Accordingly, in the display device according to an exemplary embodiment of the present disclosure, an average value of the data charging rate of the sub-pixel emitting light in the vertical stripe pattern can be set to be the same by setting a gate turn-on order differently for each frame.

Accordingly, in the display device according to an exemplary embodiment of the present disclosure, line defects do not occur even in a specific pattern, which may be a horizontal stripe pattern of FIG. 5A, 5B. or a vertical stripe pattern. As a result, image quality of the display device according to an exemplary embodiment of the present disclosure may be improved.

The exemplary embodiments of the present disclosure can also be described as follows:

A display device according to an exemplary embodiment of the present disclosure includes a display panel in which a plurality of pixels including a first sub-pixel, a second sub-pixel, a third sub-pixel, and a fourth sub-pixel that have different colors are disposed; a data driver configured to supply data voltages to the plurality of pixels through a plurality of data lines; and a gate driver configured to supply gate signals to the plurality of pixels through a plurality of gate lines; wherein the first sub-pixel, the second sub-pixel, the third sub-pixel, and the fourth sub-pixel are sequentially disposed in the same column, so that it is possible to improve a charging rate of a data voltage.

A disposition relationship of the first sub-pixel, the second sub-pixel, the third sub-pixel, and the fourth sub-pixel disposed in an odd-numbered column may be symmetrical with a disposition relationship of the first sub-pixel, the second sub-pixel, the third sub-pixel, and the fourth sub-pixel disposed in an even-numbered column. A disposition relationship of the first sub-pixel, the second sub-pixel, the third sub-pixel, and the fourth sub-pixel disposed in an odd-numbered column may be positioned as a 180 degree rotation with respect to a disposition relationship of the first sub-pixel, the second sub-pixel, the third sub-pixel, and the fourth sub-pixel disposed in an even-numbered column, and vice versa.

The first sub-pixel may include a first light emitting element and a first circuit element, the second sub-pixel may include a second light emitting element and a second circuit element, the third sub-pixel may include a third light emitting element and a third circuit element, and the fourth sub-pixel may include a fourth light emitting element and a fourth circuit element.

The display device may further comprise a plurality of reference voltage lines configured to sense the plurality of pixels.

Each of the plurality of reference voltage lines may be disposed between the first light emitting element and the first circuit element, may be disposed between the second light emitting element and the second circuit element, may be disposed between the third light emitting element and the third circuit element, and may be disposed between the fourth light emitting element and a fourth circuit element.

For each of the plurality of sub-pixels, the first circuit element and the third circuit element may be disposed to be opposite to the second circuit element and the fourth circuit element with respect to each of the plurality of reference voltage lines.

Each of the plurality of data lines may include a first data line connected to a plurality of first sub-pixels, a second data line connected to a plurality of second sub-pixels, a third data line connected to a plurality of third sub-pixels and a fourth data line connected to the fourth sub-pixels.

The first data line and the third data line may be disposed on one side of the plurality of pixels sequentially disposed in the same column, the second data line and the fourth data line may be disposed on the other side of the plurality of pixels sequentially disposed in the same column.

The first circuit element and the third circuit element may be disposed adjacent to the first data line and the third data line than the second data line and the fourth data line, and the second circuit element and the fourth circuit element may be disposed adjacent to the second data line and the fourth data line than the first data line and the third data line.

A high potential voltage line may be disposed between the first data line and the third data line, and a high potential voltage line may be disposed between the second data line and the fourth data line.

Each of the plurality of gate lines may be disposed between the first sub-pixel and the second sub-pixel; or may be disposed between the third sub-pixel and the fourth sub-pixel.

An odd-numbered gate line among the plurality of gate lines may be disposed between the first sub-pixel and the second sub-pixel disposed in an odd-numbered column, and may be disposed between the third sub-pixel and the fourth sub-pixel disposed in an even-numbered column.

An even-numbered gate line among the plurality of gate lines may be disposed between the third sub-pixel and the fourth sub-pixel disposed in an odd-numbered column, and may be disposed between the first sub-pixel and the second sub-pixel disposed in an even-numbered column.

A turn-on sequence of the plurality of gate lines in an even-numbered frame may be different from a turn-on order of the plurality of gate lines in an odd-numbered frame.

The plurality of gate lines may include a first gate line, a second gate line, a third gate line, and a fourth gate line that may be sequentially disposed.

In an even-numbered frame, the first gate line, the second gate line, the fourth gate line, and the third gate line may be turned on in an order.

In an odd-numbered frame, the second gate line, the first gate line, the third gate line, and the fourth gate line may be turned on in an order.

Each of the first sub-pixel, the second sub-pixel, the third sub-pixel, and the fourth sub-pixel may include, a switching transistor, a driving transistor, a storage capacitor, a sensing transistor, and a light emitting element.

The sensing transistor outputs a threshold voltage and a voltage for sensing mobility of the driving transistor to a reference voltage line.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The invention claimed is:

1. A display device, comprising:
    a display panel in which a plurality of pixels including a first sub-pixel, a second sub-pixel, a third sub-pixel, and a fourth sub-pixel that have different colors are disposed;
    a data driver configured to supply data voltages to the plurality of pixels through a plurality of data lines; and
    a gate driver configured to supply gate signals to the plurality of pixels through a plurality of gate lines;
    wherein the first sub-pixel, the second sub-pixel, the third sub-pixel, and the fourth sub-pixel are sequentially disposed in the same column,
    wherein positioning of the first sub-pixel, the second sub-pixel, the third sub-pixel, and the fourth sub-pixel disposed in an n+1th column is arranged so as to be a 180 degree rotation of the first sub-pixel, the second sub-pixel, the third sub-pixel, and the fourth sub-pixel disposed in an nth column and is arranged so as to be a 180 degree rotation of the first sub-pixel, the second sub-pixel, the third sub-pixel, and the fourth sub-pixel disposed in an n+2th column, n being a positive integer.

2. The display device of claim 1,
    wherein the first sub-pixel includes a first light emitting element and a first circuit element,
    the second sub-pixel includes a second light emitting element and a second circuit element,
    the third sub-pixel includes a third light emitting element and a third circuit element, and
    the fourth sub-pixel includes a fourth light emitting element and a fourth circuit element.

3. The display device of claim 2, further comprising:
    a plurality of reference voltage lines,
    wherein each of the plurality of reference voltage lines is disposed between the first light emitting element and the first circuit element, between the second light emitting element and the second circuit element, between the third light emitting element and the third circuit element, and between the fourth light emitting element and a fourth circuit element.

4. The display device of claim 2,
    wherein for each of the plurality of pixels,
    the first to fourth circuit elements may be disposed in a saw tooth arrangement within the same pixel and/or wherein for each of the plurality of pixels, the first to fourth light emitting elements may be disposed in a saw tooth arrangement within the same pixel.

5. The display device of claim 2,
    wherein each of the plurality of data lines includes a first data line connected to a plurality of first sub-pixels, a second data line connected to a plurality of second sub-pixels, a third data line connected to a plurality of third sub-pixels and a fourth data line connected to the fourth sub-pixels,
    wherein the first data line and the third data line are disposed on a first side of the plurality of pixels sequentially disposed in the same column,
    wherein the second data line and the fourth data line are disposed on a second side of the plurality of pixels sequentially disposed in the same column.

6. The display device of claim 5,
    wherein the first circuit element and the third circuit element are disposed adjacent to the first data line and the third data line rather than the second data line and the fourth data line, and
    the second circuit element and the fourth circuit element are disposed adjacent to the second data line and the fourth data line rather than the first data line and the third data line.

7. The display device of claim 5,
    wherein a high potential voltage line is disposed between the first data line and the third data line, and
    a high potential voltage line is disposed between the second data line and the fourth data line.

8. The display device of claim 1,
    wherein each of the plurality of gate lines is disposed between the first sub-pixel and the second sub-pixel;

and/or is disposed between the third sub-pixel and the fourth sub-pixel.

9. The display device of claim 1,
wherein an odd-numbered gate line among the plurality of gate lines is disposed between the first sub-pixel and the second sub-pixel disposed in an odd-numbered column, and between the third sub-pixel and the fourth sub-pixel disposed in an even-numbered column.

10. The display device of claim 1,
wherein an even-numbered gate line among the plurality of gate lines is disposed between the third sub-pixel and the fourth sub-pixel disposed in an odd-numbered column, and is disposed between the first sub-pixel and the second sub-pixel disposed in an even-numbered column.

11. The display device of claim 1,
wherein each of the first sub-pixel, the second sub-pixel, the third sub-pixel, and the fourth sub-pixel includes, a switching transistor, a driving transistor, a storage capacitor, a sensing transistor, and a light emitting element,
wherein the sensing transistor outputs a threshold voltage and a voltage for sensing mobility of the driving transistor to a reference voltage line.

12. A method of driving the display device of claim 1, the method comprising:
turning-on the plurality of gate lines in an even-numbered frame in a different order than the plurality of gate lines in an odd-numbered frame.

13. The method of claim 12 wherein the turn-on order in an odd-numbered frame is a first gate line, a second gate line, a fourth gate line, and a third gate line, and the turn-on order in an even-numbered frame is the second gate line, the first gate line, the third gate line, and the fourth gate line.

14. The method of claim 12 wherein during an odd-numbered frame:
in a first horizontal period, a first gate voltage at a turn-on level is applied to the first gate line, so that a sub-pixel is charged with the data voltage;
in a second horizontal period, a second gate voltage at a turn-on level is applied to the second gate line, so that a sub-pixel is charged with the data voltage;
in a third horizontal period, a fourth gate voltage at a turn-on level is applied to the fourth gate line, so that a sub-pixel is discharged;
in the fourth horizontal period, a third gate voltage at a turn-on level is applied to the third gate line, so that a sub-pixel is discharged; and optionally wherein:
in the first horizontal period in which the charging of the data voltage is started, the data charging rate of the sub-pixel may be 40-70%;
in the second horizontal period in which the charging of the data voltage is completed, the charging rate of the sub-pixel may be 95-100%;
in the third horizontal period and the fourth horizontal period in which the data voltage is discharged, the charging rate of the respective sub-pixels may be 0%.

15. The method of claim 14 wherein during an even-numbered frame:
in a first horizontal period, the second gate voltage at a turn-on level is applied to the second gate line, so that a sub-pixel is charged with the data voltage;
in a second horizontal period, the first gate voltage at a turn-on level is applied to the first gate line, so that a sub-pixel is charged with the data voltage;
in a third horizontal period, the third gate voltage at a turn-on level is applied to the third gate line, so that a sub-pixel is discharged;
in a fourth horizontal period, the fourth gate voltage at a turn-on level is applied to the fourth gate line, so that a sub-pixel is discharged; and wherein:
in the first horizontal period in which the charging of the data voltage is started, the data charging rate of the sub-pixel may be 40-70%;
in the second horizontal period in which the charging of the data voltage is completed, the charging rate of the sub-pixel may be 95-100%; and
in the third horizontal period and the fourth horizontal period in which the data voltage is discharged, the charging rate of the respective sub-pixels may be 0%.

* * * * *